(12) United States Patent
Cho et al.

(10) Patent No.: US 9,117,768 B2
(45) Date of Patent: Aug. 25, 2015

(54) DISPLAY SUBSTRATE HAVING A THIN FILM TRANSISTOR AND METHOD OF MANUFACTURING THE SAME

(71) Applicant: Samsung Display Co., LTD., Yongin, Gyeonggi-Do (KR)

(72) Inventors: Ki-Hyun Cho, Suwon-si (KR); Jeong-Won Kim, Seoul (KR); Kwang-Woo Park, Hwaseong-si (KR); Chul-Won Park, Gwangmyeong-si (KR)

(73) Assignee: SAMSUNG DISPLAY CO., LTD. (KR)

( * ) Notice: Subject to any disclaimer, the term of this patent is extended or adjusted under 35 U.S.C. 154(b) by 0 days.

(21) Appl. No.: 14/148,386

(22) Filed: Jan. 6, 2014

(65) Prior Publication Data
US 2015/0008426 A1    Jan. 8, 2015

(30) Foreign Application Priority Data
Jul. 3, 2013    (KR) .................. 10-2013-0077551

(51) Int. Cl.
*H01L 21/311*    (2006.01)
*H01L 27/12*    (2006.01)
*H01L 27/32*    (2006.01)

(52) U.S. Cl.
CPC ...... *H01L 21/31116* (2013.01); *H01L 21/31105* (2013.01); *H01L 21/31111* (2013.01); *H01L 27/127* (2013.01); *H01L 27/1225* (2013.01); *H01L 27/1248* (2013.01);
(Continued)

(58) Field of Classification Search
CPC ............ H01L 27/3244; H01L 27/1248; H01L 29/4908; H01L 2224/8592; H01L 2251/56; H01L 23/481; H01L 23/562; H01L 27/3258; H01L 27/03; H01L 21/31111; H01L 21/31116; H01L 27/3262; H01L 21/31105
USPC ............ 257/9, 43, 49, 52, 53, 57, 59, 72, 88, 257/E21.151, E27.131; 438/85.104, 149, 438/151, 155, 482, 488
See application file for complete search history.

(56) References Cited

U.S. PATENT DOCUMENTS

| 7,907,226 B2 * | 3/2011 | Yang et al. ............. 349/43 |
| 8,110,830 B2 | 2/2012 | Lim et al. |

(Continued)

FOREIGN PATENT DOCUMENTS

| KR | 1020000003173 A | 1/2000 |
| KR | 1020000026540 A | 5/2000 |

(Continued)

*Primary Examiner* — Eduardo A Rodela
(74) *Attorney, Agent, or Firm* — Cantor Colburn LLP

(57) ABSTRACT

In a method for manufacturing a display substrate, a thin film transistor is formed on a base substrate. The thin film transistor includes a gate electrode, an active pattern, a source electrode and a drain electrode. A first passivation layer is formed to cover the thin film transistor. A second passivation layer is formed on the first passivation layer. A photoresist pattern is formed to partially expose the second passivation layer. The first passivation layer and the second passivation layer are partially removed to form a contact hole exposing the drain electrode. A pixel electrode layer is formed on the second passivation layer, the drain electrode and the photoresist pattern. A portion of the pixel electrode layer and the second photoresist pattern are removed to form a pixel electrode. The portion of the pixel electrode layer is disposed on a top surface and a sidewall of the photoresist pattern.

15 Claims, 15 Drawing Sheets

(52) U.S. Cl.
CPC ......... *H01L 27/326* (2013.01); *H01L 27/3244* (2013.01); *H01L 27/3248* (2013.01); *H01L 27/3258* (2013.01); *H01L 27/3262* (2013.01); *H01L 27/3276* (2013.01)

(56) References Cited

U.S. PATENT DOCUMENTS

| | | | |
|---|---|---|---|
| 8,269,232 B2 * | 9/2012 | Deng et al. | 257/89 |
| 2006/0138426 A1 * | 6/2006 | Yoo et al. | 257/72 |
| 2008/0164471 A1 * | 7/2008 | Choung et al. | 257/59 |
| 2009/0283769 A1 * | 11/2009 | Park et al. | 257/59 |
| 2009/0321740 A1 * | 12/2009 | Xiao et al. | 257/59 |
| 2012/0170784 A1 * | 7/2012 | Kimura | 381/333 |
| 2012/0241746 A1 * | 9/2012 | Xie et al. | 257/59 |

FOREIGN PATENT DOCUMENTS

| | | |
|---|---|---|
| KR | 1020060070067 A | 6/2006 |
| KR | 1020070119447 A | 12/2007 |
| KR | 1020110125399 A | 11/2011 |

* cited by examiner

DISPLAY SUBSTRATE HAVING A THIN FILM TRANSISTOR AND METHOD OF MANUFACTURING THE SAME

This application claims priority to Korean Patent Application No. 10-2013-0077551, filed on Jul. 3, 2013, and all the benefits accruing therefrom under 35 U.S.C. §119, the contents of which application are herein incorporated by reference in their entirety.

BACKGROUND

1. Field

The invention relates to a display substrate having a thin film transistor and a method of manufacturing the display substrate.

2. Description of the Related Art

Generally, a thin film transistor for driving a pixel in a display device includes a gate electrode, a source electrode, a drain electrode, and an active pattern forming a channel between the source electrode and the drain electrode. The active pattern includes a semiconductor layer including amorphous silicon, polycrystalline silicon, oxide semiconductor, or the like.

Amorphous silicon has a relatively low electron mobility, which may be about 1 square centimeter per volt second ($cm^2/V \cdot s$) to about 10 $cm^2/V \cdot s$, so that a thin film transistor including amorphous silicon has relatively low driving characteristics. In contrast, polycrystalline silicon has a relatively high electron mobility, which may be about 10 $cm^2/V$ to about hundreds $cm^2/V$.

SUMMARY

One or more exemplary embodiment provides a display substrate having improved reliability.

One or more exemplary embodiment provides a method of manufacturing a display substrate using a reduced number of masks.

According to an exemplary embodiment, a method for manufacturing a thin film transistor is provided. In the method, a thin film transistor is formed on a base substrate. The thin film transistor includes a gate electrode, an active pattern, a source electrode and a drain electrode. A first passivation layer is formed to cover the thin film transistor. A second passivation layer is formed on the first passivation layer. A first photoresist pattern is formed to partially expose the second passivation layer. The first passivation layer and the second passivation layer are partially removed to form a contact hole exposing the drain electrode. A pixel electrode layer is formed on the second passivation layer, the drain electrode and the first photoresist pattern. A portion of the pixel electrode layer and the first photoresist pattern are removed to form a pixel electrode. The portion of the pixel electrode layer is disposed on a top surface and a sidewall of the first photoresist pattern.

In an exemplary embodiment, the removing the first passivation layer and the second passivation layer includes performing a dry etching process. The dry etching process uses an etching solution having a higher etch rate with respect to the first passivation layer compared to an etch rate with respect to the second passivation layer.

In an exemplary embodiment, a first distance between sidewalls of the first passivation layer exposed by the contact hole is larger than a second distance between sidewalls of the second passivation layer exposed by the contact hole.

In an exemplary embodiment, an annealing process is further performed to form a crack in the pixel electrode layer before the removing the portion of the pixel electrode layer to form the pixel electrode.

In an exemplary embodiment, the first passivation layer includes a first insulation material, and the second passivation layer includes a second insulation material different from the first insulation material.

In an exemplary embodiment, the first passivation layer includes silicon nitride, and the second passivation layer includes silicon oxide.

In an exemplary embodiment, the active pattern includes a metal oxide semiconductor.

In an exemplary embodiment, the forming the thin film transistor includes forming the gate electrode on the base substrate, forming a gate insulation layer covering the gate electrode, forming a metal oxide semiconductor layer on the gate insulation layer and overlapping the gate electrode, forming a data metal layer on the metal oxide semiconductor layer and partially removing the metal oxide semiconductor layer and the data metal layer to form the source electrode, the drain electrode and the active pattern, simultaneously.

In an exemplary embodiment, an etch stopper is further formed on the metal oxide semiconductor layer, before the forming the data metal layer.

In an exemplary embodiment, the partially removing the metal oxide semiconductor layer and the data metal layer includes forming a second photoresist pattern on the data metal layer and etching the data metal layer using the second photoresist pattern as an etching mask. The etching is performed until a top surface of the etch stopper is exposed.

In an exemplary embodiment, the partially removing the metal oxide semiconductor layer and the data metal layer includes forming a photoresist layer on the data metal layer, forming a second photoresist pattern having a stepped portion by using a half-tone mask or a slit mask and etching the data metal layer using the second photoresist pattern as an etching mask. The etching is performed until a top surface of the etch stopper is exposed.

In an exemplary embodiment, the metal oxide semiconductor layer is annealed at a temperature of about 100 degrees Celsius (° C.) to about 700° C.

In an exemplary embodiment, an oxide layer is further formed on the metal semiconductor oxide layer before forming the data metal layer. The oxide layer includes indium-zinc oxide, indium-tin oxide, gallium-zinc oxide or zinc-aluminum oxide. The partially removing the metal oxide semiconductor layer and the data metal layer further includes partially removing the oxide layer.

According to another exemplary embodiment, a method for manufacturing a thin film transistor is provided. In the method, a gate electrode is formed on a base substrate. A gate insulation layer is formed to cover the gate electrode. A metal oxide semiconductor layer is formed on the gate insulation layer. The metal oxide semiconductor layer overlaps with the gate electrode. An oxide layer is formed on the metal oxide semiconductor layer. A data metal layer is formed on the oxide layer. The metal oxide semiconductor layer, the oxide layer and the data metal layer are partially removed to form the source electrode, the drain electrode and the active pattern, simultaneously.

In an exemplary embodiment, an etch stopper is further formed on the metal oxide semiconductor layer, before the forming the oxide layer.

In an exemplary embodiment, the oxide layer includes indium-zinc oxide, indium-tin oxide, gallium-zinc oxide or zinc-aluminum oxide. The data metal layer includes a plurality of metal layers including a first metal layer including copper and a second metal layer including an alloy of copper and manganese.

According to still another exemplary embodiment, a display substrate include a gate electrode, an active pattern, a source electrode, a drain electrode, a first passivation layer, a second passivation layer and a pixel electrode. The gate electrode is disposed on a base substrate. The active pattern overlaps with the gate electrode. The active pattern includes a metal oxide semiconductor. The source electrode contacts the active pattern. The drain electrode contacts the active pattern. The drain electrode is spaced apart from the source electrode. The first passivation layer covers the active pattern, the source electrode and the drain electrode. The first passivation layer includes a first insulation material. The second passivation layer is disposed on the first passivation layer. The second passivation layer includes a second insulation material different from the first insulation material. The pixel electrode is electrically connected to the drain electrode through a contact hole. The contact hole penetrates the first passivation layer and a second passivation layer.

In an exemplary embodiment, a first distance between sidewalls of the first passivation layer exposed by the contact hole is larger than a second distance between sidewalls of the second passivation layer exposed by the contact hole.

In an exemplary embodiment, the first passivation layer includes silicon nitride, and the second passivation layer includes silicon oxide.

In an exemplary embodiment, an etch stopper is further disposed on the active pattern between the source electrode and the drain electrode.

BRIEF DESCRIPTION OF THE DRAWINGS

The above and other features and advantages will become more apparent by describing exemplary embodiments thereof with reference to the accompanying drawings, in which.

DETAILED DESCRIPTION

Figure 1:
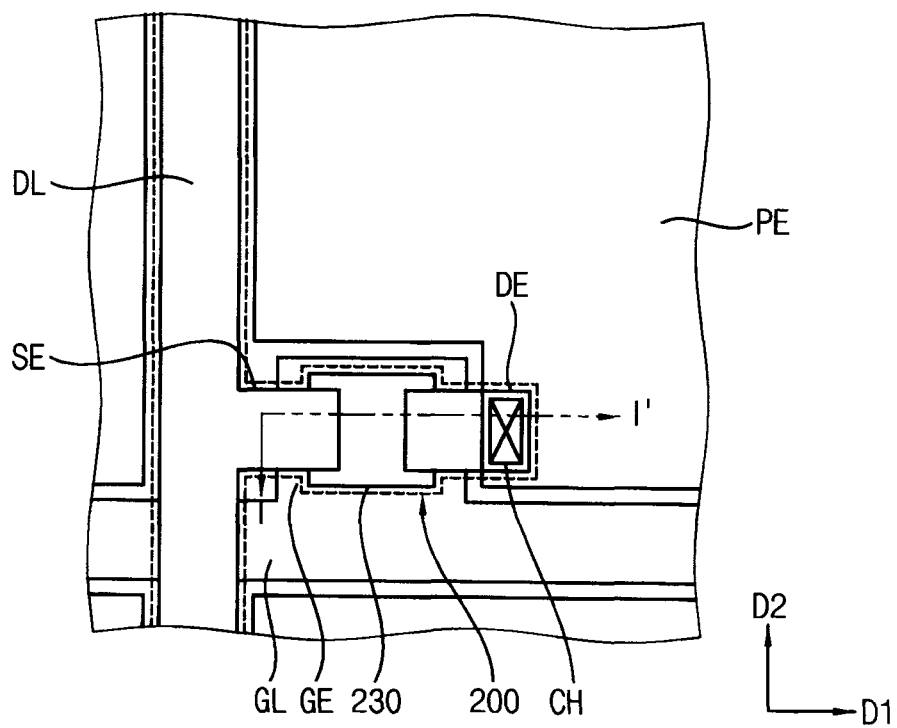
FIG. 1 is a plan view illustrating an exemplary embodiment of a display substrate according to the invention.

The invention is described more fully hereinafter with reference to the accompanying drawings, in which exemplary embodiments of the invention are shown. This invention may, however, be embodied in many different forms and should not be construed as limited to the exemplary embodiments set forth herein. Rather, these embodiments are provided so that this disclosure will be thorough and complete, and will fully convey the scope of the invention to those skilled in the art. In the drawings, the size and relative sizes of layers and regions may be exaggerated for clarity.

It will be understood that when an element or layer is referred to as being "on," "connected to" or "coupled to" another element or layer, the element or layer can be directly on, connected or coupled to another element or layer or intervening elements or layers. In contrast, when an element is referred to as being "directly on," "directly connected to" or "directly coupled to" another element or layer, there are no intervening elements or layers present. As used herein, connected may refer to elements being physically and/or electrically connected to each other. Like numbers refer to like elements throughout. As used herein, the term "and/or" includes any and all combinations of one or more of the associated listed items.

It will be understood that, although the terms first, second, third, etc., may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section without departing from the teachings of the invention.

Spatially relative terms, such as "lower," "under," "above," "upper" and the like, may be used herein for ease of description to describe the relationship of one element or feature to another element(s) or feature(s) as illustrated in the figures. It will be understood that the spatially relative terms are intended to encompass different orientations of the device in use or operation, in addition to the orientation depicted in the figures. For example, if the device in the figures is turned over, elements described as "lower" or "under" relative to other elements or features would then be oriented "above" relative to the other elements or features. Thus, the exemplary term "under" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of the invention. As used herein, the singular forms "a," "an" and "the" are intended to include the plural forms as well, unless the context clearly indicates otherwise. It will be further understood that the terms "comprises," "comprising," "includes" and/or "including," when used in this specification, specify the presence of stated features, integers, operations, elements, and/or components, but do not preclude the presence or addition of one or more other features, integers, steps, operations, elements, components, and/or groups thereof.

Embodiments of the invention are described herein with reference to cross-section illustrations that are schematic illustrations of idealized embodiments (and intermediate structures) of the invention. As such, variations from the shapes of the illustrations as a result, for example, of manufacturing techniques and/or tolerances, are to be expected. Thus, embodiments of the invention should not be construed as limited to the particular shapes of regions illustrated herein but are to include deviations in shapes that result, for example, from manufacturing.

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" can mean within one or more standard deviations, or within ±30%, 20%, 10%, 5% of the stated value.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

All methods described herein can be performed in a suitable order unless otherwise indicated herein or otherwise clearly contradicted by context. The use of any and all examples, or exemplary language (e.g., "such as"), is intended merely to better illustrate the invention and does not pose a limitation on the scope of the invention unless otherwise claimed. No language in the specification should be construed as indicating any non-claimed element as essential to the practice of the invention as used herein.

A crystallization process is required for forming polycrystalline silicon. Thus, forming a uniform polycrystalline silicon layer on a large-sized substrate may be difficult, and resulting manufacturing costs are high. Oxide semiconductors may be formed through a low-temperature process, may be easily formed in a large-scale, and have a high electron mobility. Thus, research is actively being conducted on thin film transistors which include an oxide semiconductor.

In the method of manufacturing a thin film transistor for driving a pixel in a display device, patterning processes using masks are performed repeatedly. However, as the number of masks increases, the manufacturing cost and time increase.

Hereinafter, exemplary embodiments of the invention will be explained in detail with reference to the accompanying drawings.

Figure 2:
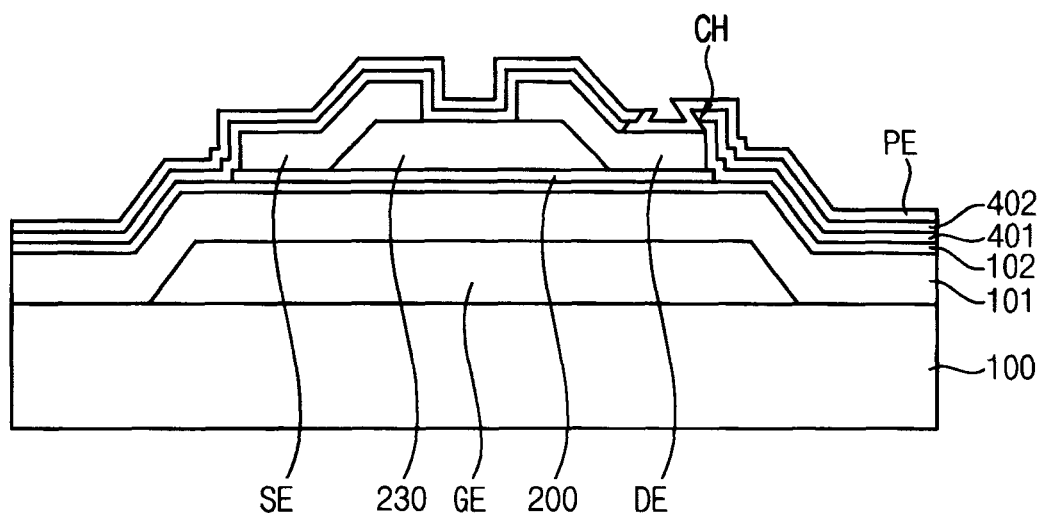
FIG. 2 is a cross-sectional view taken along line I-I' of FIG. 1.

FIG. 1 is a plan view illustrating an exemplary embodiment of a display substrate according to the invention. FIG. 2 is a cross-sectional view taken along line I-I' of FIG. 1.

Referring to FIGS. 1 and 2, an exemplary embodiment of a display substrate according to the invention includes a base substrate 100, a gate line GL, a data line DL, a first gate insulation layer 101, a second gate insulation layer 102, a thin film transistor, a first passivation layer 401, a second passivation layer 402 and a pixel electrode PE. The thin film transistor includes a gate electrode GE, an active pattern 200, an etch stopper 230, a source electrode SE and a drain electrode DE.

The gate line GL extends in a first direction D1, and the data line DL extends in a second direction D2 in a plan view. The first direction D1 crosses the second direction D2. In one exemplary embodiment, the first direction D1 may be substantially perpendicular to the second direction D2.

The gate line GL is electrically connected to the gate electrode GE. In one exemplary embodiment, for example, the gate electrode GE may protrude from the gate line GL in the second direction D2.

The first gate insulation layer 101 and the second gate insulation layer 102 are sequentially stacked on the base substrate 100 to cover the gate line GL and the gate electrode GE. In one exemplary embodiment, for example, the first gate insulation layer 101 may include silicon oxide, and the second gate insulation layer 102 may include silicon nitride. In another exemplary embodiment, the second gate insulation layer 102 may be omitted.

The active pattern 200 overlaps with the gate electrode GE. The active pattern 200 includes a metal oxide semiconductor. That is, the active pattern 200 may include an oxide of indium, zinc, gallium, tin or hafnium. In one exemplary embodiment, for example, the active pattern 200 may include indium-zinc-tin oxide ("IZTO"), indium-gallium-zinc oxide ("IGZO") or hafnium-indium-zinc oxide ("HIZO").

The etch stopper 230 is disposed on the active pattern 200. In one exemplary embodiment, for example, the etch stopper 230 may include an insulation material such as silicon oxide.

The source electrode SE and the drain electrode DE are spaced apart from each other, and contact the active pattern 200. The source electrode SE and the drain electrode DE may have single-layered (e.g., monolayer) structure or a multi-layer structure. In one exemplary embodiment, each of the source electrode SE and the drain electrode DE may include a first conductive pattern and a second conductive pattern (not illustrated) which are stacked sequentially. The first conductive pattern and the second conductive pattern may include aluminum, copper, molybdenum, tantalum, tungsten, neodymium, chromium, silver, manganese, alloy thereof and the like. In one exemplary embodiment, for example, the first conductive pattern may include copper, and the second conductive pattern may include an alloy of copper and manganese.

In one exemplary embodiment, each of the source electrode SE and the drain electrode DE may further includes a metal oxide pattern. In one exemplary embodiment, for example, the metal oxide pattern may include indium-zinc oxide ("IZO"), indium-tin oxide ("ITO"), gallium-zinc oxide ("GZO") or zinc-aluminum oxide ("ZAO"). The metal oxide pattern is disposed adjacent to the active pattern 200, so that the metal oxide pattern reduces a contact resistance respectively between the active pattern 200, and the source electrode SE or the drain electrode DE.

The data line DL is electrically connected to the source electrode SE. In one exemplary embodiment, for example, the source electrode SE may protrude from the data line DL in the first direction D1.

The first passivation layer 401 and the second passivation layer 402 are sequentially stacked to cover the thin film transistor. The first passivation layer 401 and the second passivation layer 402 may include insulation materials that are different from each other. In one exemplary embodiment, for example, the first passivation layer 401 may include silicon nitride, and the second passivation layer 402 may include silicon oxide.

The pixel electrode PE is disposed on the second passivation layer 402. A contact hole CH is defined in the first and second passivation layers 401 and 402, and exposes the drain electrode DE. The pixel electrode PE penetrates the first passivation layer 401 and the second passivation layer 402 through the contact hole CH, so that the pixel electrode PE contacts the drain electrode DE. The pixel electrode PE includes a transparent conductive material. For example, the pixel electrode PE may include IZO, ITO, tin oxide or zinc oxide.

In an exemplary embodiment of manufacturing the display substrate, the contact hole CH is formed by using an etching gas having a relatively high etch rate with respect to the first passivation layer 401 compared to an etch rate with respect to the second passivation layer 402. Therefore, the first passivation layer 401 may be etched faster than the second passivation layer 402. Accordingly, a first distance between sidewalls of the first passivation layer 401 exposed by the contact hole CH may be substantially larger than a second distance between sidewalls of the second passivation layer 402. The distances may be taken in the first and/or second directions D1 and D2, in the plan view.

In another exemplary embodiment, an organic insulation layer (not shown) having a flat top surface may be additionally disposed between the second passivation layer 402 and the pixel electrode PE.

FIGS. 3 to 12 are cross-sectional views illustrating an exemplary embodiment of a method of manufacturing the display substrate illustrated in FIGS. 1 and 2.

Figure 3:
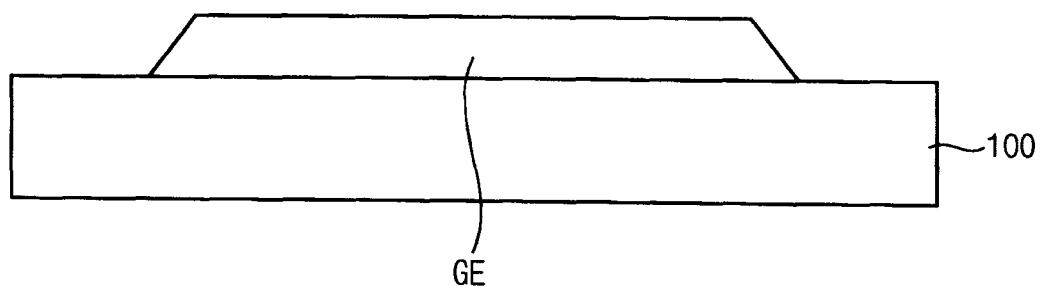
FIGS. 3 to 12 are cross-sectional views illustrating an exemplary embodiment of a method of manufacturing the display substrate illustrated in FIGS. 1 and 2.

Referring to FIG. 3, a gate line GL and a gate electrode GE are formed on a base substrate 100.

In one exemplary embodiment of forming the gate line GL and the gate electrode GE, a gate metal layer is formed on the base substrate 100, and then the gate metal layer is patterned to form the gate line GL and the gate electrode GE. The base substrate 100 may include a glass substrate, a quartz substrate, a silicon substrate, a plastic substrate and the like.

A material that may be used for forming the gate metal layer may include copper, silver, chromium, molybdenum, aluminum, titanium, manganese, alloy thereof and the like. The gate metal layer may have a single-layered structure, or a multi-layered structure including a plurality of metal layers including different metals.

Figure 4:
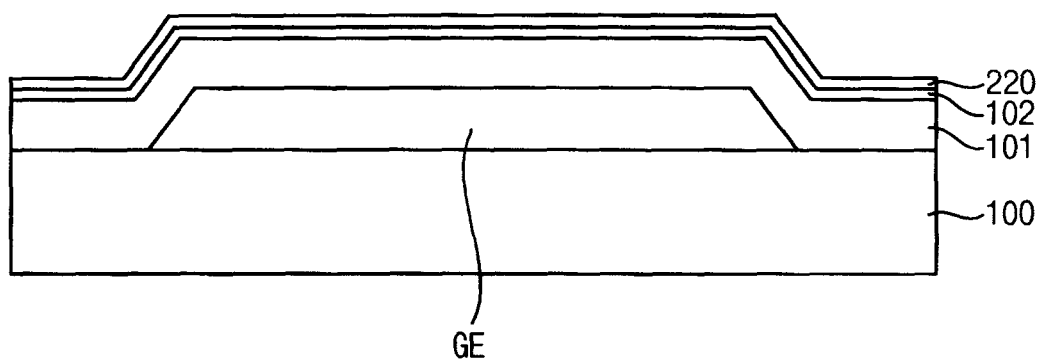

Referring to FIG. 4, a first gate insulation layer 101, a second gate insulation layer 102 and an oxide semiconductor layer 220 are formed on the base substrate 100 to cover the gate line GL and the gate electrode GE.

The first gate insulation layer 101 and the second gate insulation layer 102 may be formed by a chemical vapor deposition process or an atomic layer deposition process using insulation materials that are different from each other. In one exemplary embodiment, for example, the first gate insulation layer 101 may include silicon oxide, and the second gate insulation layer 102 may include silicon nitride.

The oxide semiconductor layer 220 may be formed through conventional methods for forming an oxide semiconductor layer. In one exemplary embodiment, the oxide semiconductor layer 220 is formed through a physical vapor deposition process such as a vacuum deposition process or a sputtering process.

Particularly, the oxide semiconductor layer 220 may be formed using a sputtering target including a material substantially the same as that of the oxide semiconductor layer 220. In one exemplary embodiment, for example, the oxide semiconductor layer 220 may be formed using a sputtering target including IGZO.

In an exemplary embodiment, an annealing process may be further performed to heat the oxide semiconductor layer 220. In one exemplary embodiment, the annealing process may be performed at about 100 degrees Celsius (° C.) to about 700° C., and more specifically at about 300° C. to about 400° C. The annealing process may improve electrical characteristics of the oxide semiconductor layer 220.

Figure 5:
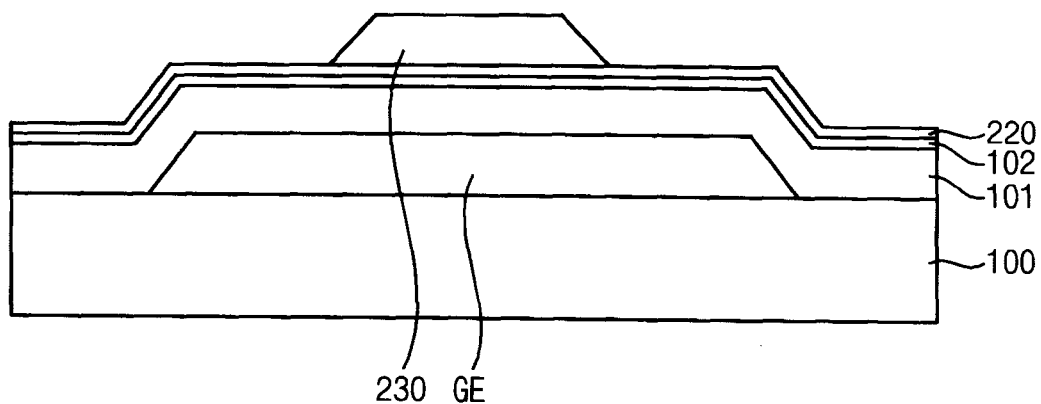

Referring to FIG. 5, an etch stopper 230 is formed on the oxide semiconductor layer 220.

In one exemplary embodiment of forming the etch stopper 230, an inorganic insulation layer may be formed on the oxide semiconductor layer 220, and then the inorganic insulation layer may be patterned to form the etch stopper 230. In one exemplary embodiment, for example, the inorganic insulation layer may include silicon oxide. The etch stopper 230 overlaps with the gate electrode GE, and may have a size smaller than that of the gate electrode GE when viewed perpendicular to a top surface of the base substrate 100, e.g., in the plan view. The etch stopper 230 may reduce or effectively prevent damage to the oxide semiconductor layer 220 by an etching process for forming a source electrode SE and a drain electrode DE (See FIGS. 6 and 7).

Figure 6:
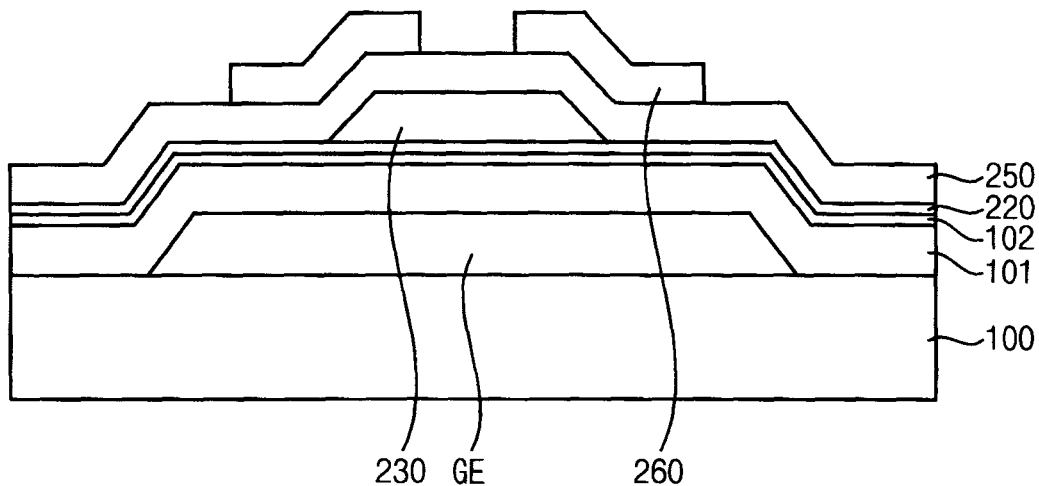

Referring to FIG. 6, a data metal layer 250 is formed on the oxide semiconductor layer 220 to cover the etch stopper 230, and a first photoresist pattern 260 is formed on the data metal layer 250.

A material that may be used for forming the data metal layer 250 may include copper, silver, chromium, molybdenum, aluminum, titanium, manganese, alloy thereof and the like. The data metal layer 250 may have a single-layered structure, or a multi-layered structure including a plurality of metal layers including different metals.

In one exemplary embodiment, the data metal layer 250 may have the multi-layered structure including a first data metal layer and a second data metal layer. In one exemplary embodiment, for example, the first data metal layer may include copper, and the second data metal layer may include an alloy of copper and manganese.

In one exemplary embodiment, a metal oxide pattern (not shown) may be further formed under the data metal layer 250. In one exemplary embodiment, for example, the metal oxide pattern may include IZO, ITO, GZO or ZAO.

In one exemplary embodiment of forming the first photoresist pattern 260, a first photoresist layer is formed on the data metal layer 250, and then an exposure process and a develop process are performed about the first photoresist layer to form the first photoresist pattern 260. The first photoresist pattern 260 is disposed in a region where the source electrode SE and the drain electrode DE will be disposed.

Figure 7:
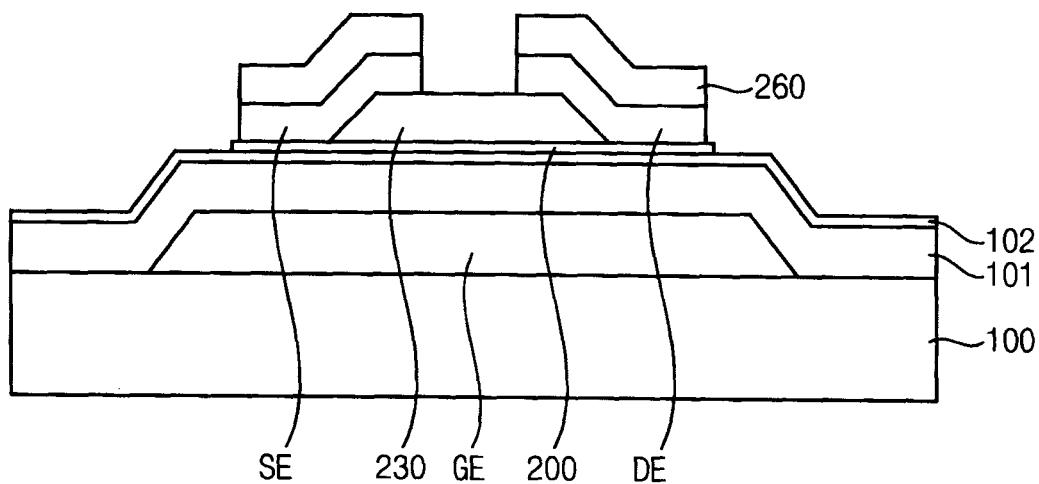

Referring to FIG. 7, the source electrode SE, the drain electrode DE and an active pattern 200 are formed by partially etching the data metal layer 250 and the oxide semiconductor layer 220.

Portions of the oxide semiconductor layer 220, which are not covered by the etch stopper 230 and the first photoresist pattern 260, are removed to form the active pattern 200.

The etching process includes a dry etching process using the first photoresist pattern 260 as an etching mask. Therefore, portions of the data metal layer 250, which are not covered by the first photoresist pattern 260, are removed by the dry etching process. The source electrode SE and the drain electrode DE respectively contact opposing end portions of the active pattern 200, which are not covered by the etch stopper 230. The source electrode SE and the drain electrode DE are spaced apart from each other to expose a portion of the etch stopper 230.

The active pattern 200, the source electrode SE and the drain electrode DE are formed simultaneously by a single patterning process using a single mask. Further, the etch stopper 230 is serve as an etching end point, so that the active pattern 200 may have a shape different from those of the source electrode SE and the drain electrode DE in a plan view. As illustrated in FIG. 7, the edges or end surfaces of the source and drain electrodes SE and DE, and the active pattern 200, are not aligned with each other, respectively. The edges of the source and drain electrodes SE and DE expose the opposing edge portions of the active pattern 200, Then, a strip process or an ashing process is performed to remove the first photoresist pattern 260.

Figure 8:
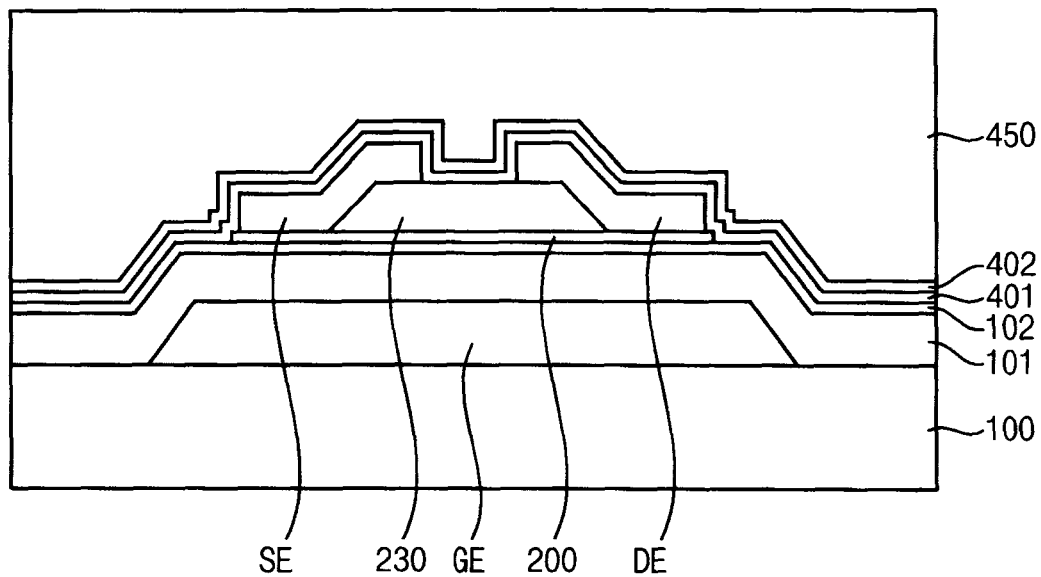

Referring to FIG. 8, a first passivation layer 401 and a second passivation layer 402 are formed to cover the source electrode SE, the drain electrode DE and the etch stopper 230, and then a second photoresist layer 450 is formed on the second passivation layer 402.

The first passivation layer 401 and the second passivation layer 402 are formed using insulation materials that are different from each other. In one exemplary embodiment, for example, the first passivation layer 401 may include silicon nitride, and the second passivation layer 402 may include silicon oxide. Therefore, the first passivation layer 401 and the second passivation layer 402 may have different etch rates for a specific etching gas.

Then, the second photoresist layer 450 may be formed by a spin coating process.

In one exemplary embodiment, the second photoresist layer 450 may be formed directly on the second passivation layer 402, but the invention is not limited thereto or thereby.

In another exemplary embodiment, an organic insulation layer (not shown) may be further formed between the second passivation layer 402 and the second photoresist layer 450. Where the organic insulation layer is further formed between the second passivation layer 402 and the second photoresist layer 450, the organic insulation layer may have a flat top surface.

Figure 9:
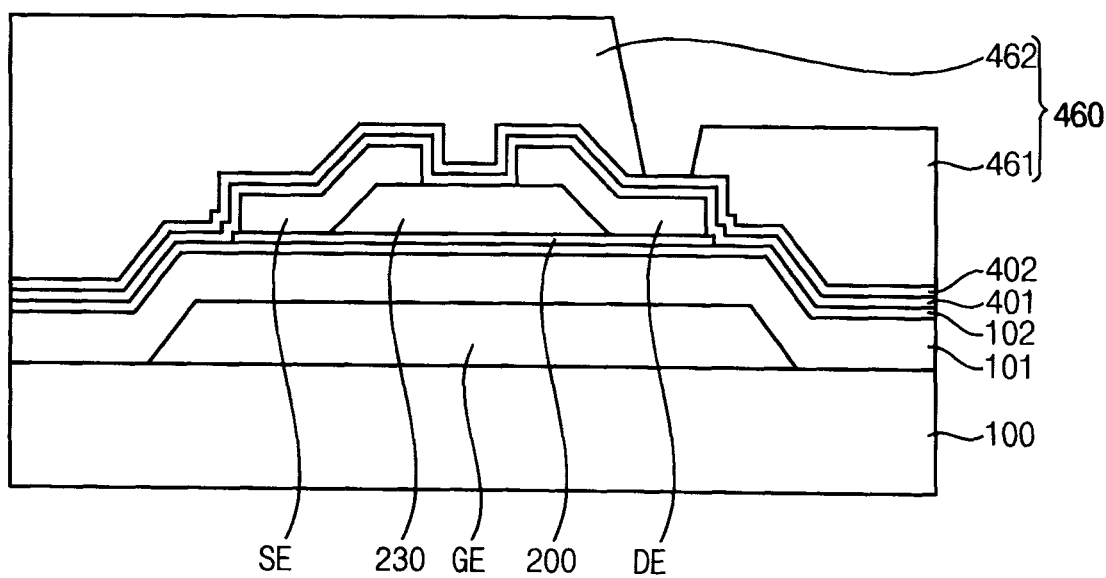

Referring to FIG. 9, a second photoresist pattern 460 is formed by partially removing the second photoresist layer 450.

The second photoresist pattern 460 is formed to include at least two portions which have different cross-sectional thicknesses. In one exemplary embodiment, for example, the second photoresist pattern 460 may include a first thickness portion 461, and a second thickness portion 462 having a larger thickness than the first thickness portion 461.

In one exemplary embodiment, the second photoresist pattern 460 may be formed by a single patterning process using a half-tone mask or a slit mask. The half-tone mask or the slit mask includes a transparent region, a semi-transparent region and an opaque region depending on a transmittance. Therefore, the second photoresist pattern 460 may have different thickness corresponding to the transparent region, the semi-transparent region and the opaque region of the half-tone mask or the slit mask.

The second photoresist pattern 460 partially exposes a top surface of the second passivation layer 402. Particularly, the second photoresist pattern 460 exposes a portion of the second passivation layer 402 that overlaps with the drain electrode DE.

Figure 10:
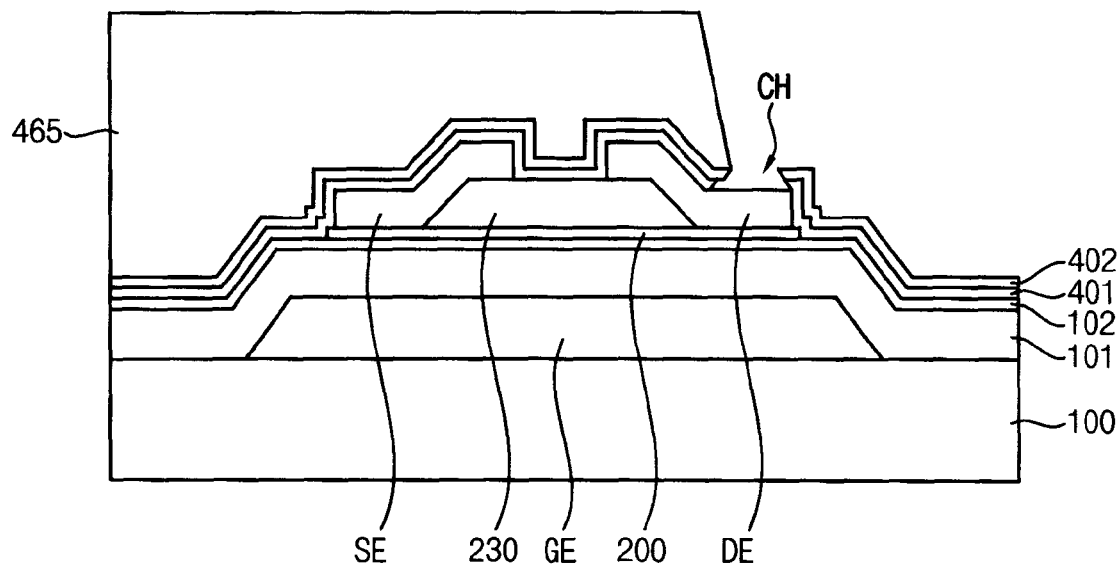

Referring to FIG. 10, the first passivation layer 401 and the second passivation layer 402 are partially removed to form a contact hole CH, and the first thickness portion 461 of the second photoresist pattern 460 is also removed.

The first passivation layer 401 and the second passivation layer 402 are removed by a dry etching process using the second photoresist pattern 460 as an etching mask. In the dry etching process, an etch rate of the first passivation layer 401 may be substantially higher than that of the second passivation layer 402. In one exemplary embodiment, for example, the etch rate of the first passivation layer 401 may be about five times to about ten times higher than that of the second passivation layer 402.

Due to the etch rate difference of the first passivation layer 401 and the second passivation layer 402, the contact hole CH may have a specific shape. That is, a first distance between sidewalls of the first passivation layer 401 exposed by the contact hole CH may be substantially larger than a second distance between sidewalls of the second passivation layer 402. A first angle may be defined by the exposed top surface of the drain electrode DE, and the sidewalls of the first and second passivation layers 401 and 402 exposed by the contact hole CH, and the first angle may be substantially smaller than 90°. A distance between lines which are vertical to the base substrate 100 and extend from locations indicating a maximum distance between sidewalls of the first passivation layer 401 may define a width of the contact hole CH. From these vertical lines, the second passivation layer 402 and a lower portion of the second photoresist pattern 460 protrude further toward an inner area of the contact hole CH than the first passivation layer 401.

Then, an etch back process is performed to partially remove the second photoresist pattern 460. In the etch back process, the first thickness portion 461 of the second photoresist pattern 460 may be entirely removed, and the second thickness portion 462 of the second photoresist pattern 460 may be partially removed to form a residual photoresist pattern 465.

Figure 11:
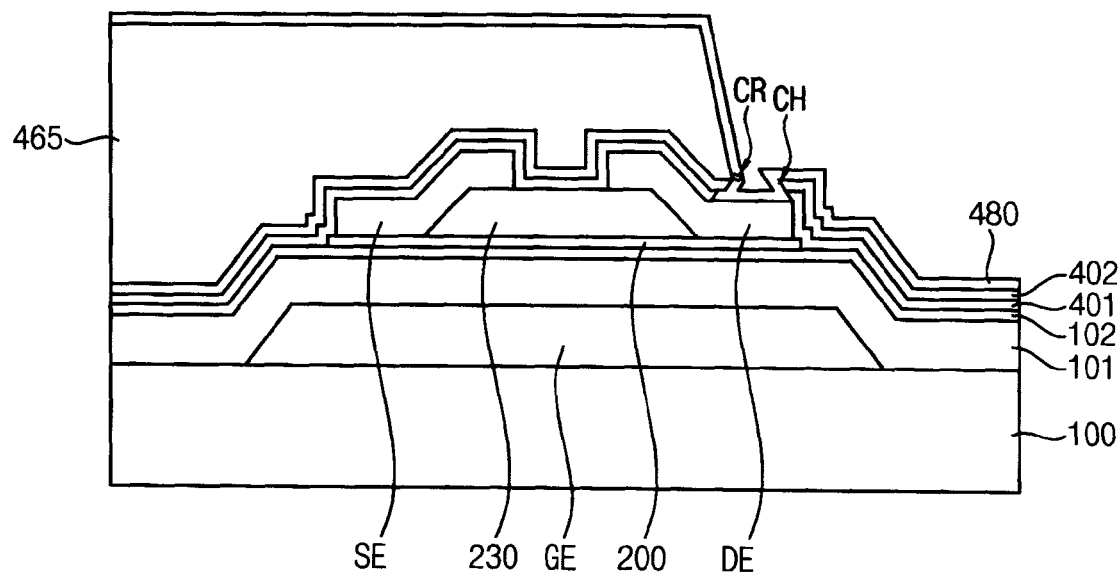

Referring to FIG. 11, a pixel electrode layer 480 is formed on the residual photoresist pattern 465, the second passivation layer 402, an inner wall of the contact hole CH and the exposed top surface of the drain electrode DE.

The pixel electrode layer 480 is formed using a transparent conductive material such as IZO, ITO, tin oxide or zinc oxide. The pixel electrode layer 480 may directly contact the drain electrode DE through the contact hole CH, and may have a uniform thickness on a bottom surface and the sidewall of the contact hole CH. The thickness is taken in a direction normal to the surface upon which it is formed. In one exemplary embodiment, the pixel electrode layer 480 may have a thickness of about 400 angstroms (Å) to about 700 Å.

Then, an annealing process is performed to heat the residual photoresist pattern 465 and the pixel electrode layer 480. In one exemplary embodiment, the annealing process may be performed at about 200° C. to about 250° C. for about 10 minutes to about 1 hour. By the anneal process, a stress is applied to the pixel electrode layer 480 due to differences of thermal expansion between the residual photoresist pattern 465 and the pixel electrode layer 480. Particularly, the second passivation layer 402 and the lower portion of the second photoresist pattern 460 form a protruding portion of the sidewall of the contact hole CH, so that the stress concentration occurs in a region where the residual photoresist pattern 465, the second passivation layer 402 and the pixel electrode layer 480 directly contact. Therefore, a crack CR occurs in the pixel electrode layer 480 adjacent to an entrance of the contact hole CH. The crack CR in the pixel electrode layer 480 separates the pixel electrode layer into a portion on a top surface and a sidewall of the residual photoresist pattern 465, and another portion disposed in the contact hole CH and extending away from the residual photoresist pattern 465.

Figure 12:
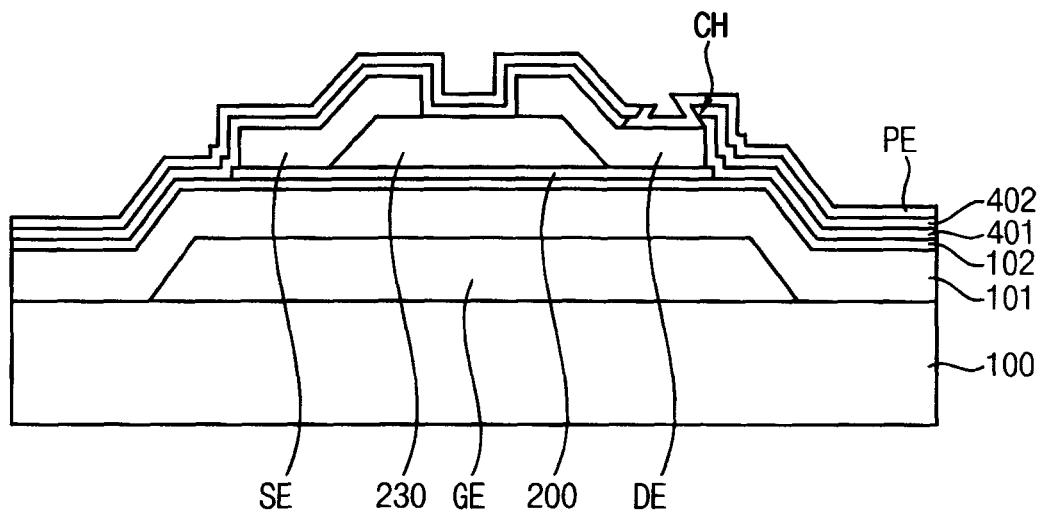

Referring to FIG. 12, a strip process is performed to remove the residual photoresist pattern 465 and a portion of the pixel electrode layer 480, thereby forming a pixel electrode PE.

The strip process may use a solution that chemically dissolves the residual photoresist pattern 465. The solution may be sprayed with a predetermined pressure, so that the residual photoresist pattern 465 may be physically removed.

As the residual photoresist pattern 465 is removed, the portion of the pixel electrode layer 480 is also removed from a top surface and a sidewall of the residual photoresist pattern 465. The crack CR in the pixel electrode layer 480 may promote the removing of the portion of the pixel electrode layer 480 from the top surface and the sidewall of the residual photoresist pattern 465. Therefore, the pixel electrode PE is formed without performing an additional photolithography process.

In the exemplary embodiment illustrated with reference to FIGS. 3 to 12, the thin film transistor of the display substrate may include an etch stopper. In another exemplary embodiment, a thin film transistor of a display substrate may not include an etch stopper. Hereinafter, a method of manufacturing a display substrate having a thin film transistor without an etch stopper will be explained.

FIGS. 13 to 16 are cross-sectional views illustrating another exemplary embodiment of a method of manufacturing a display substrate according to the invention.

Figure 13:
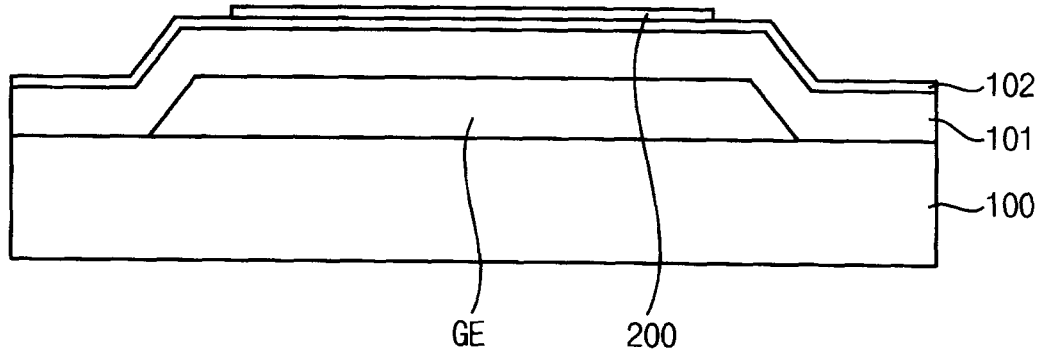
FIGS. 13 to 16 are cross-sectional views illustrating another exemplary embodiment of a method of manufacturing a display substrate according to the invention.

Referring to FIG. 13, a gate line GL and a gate electrode GE are formed on a base substrate 100. A first gate insulation layer 101, a second gate insulation layer 102 and an oxide semiconductor layer are formed to cover the gate line GL and the gate electrode GE, and then an active pattern 200 is formed by partially etching the oxide semiconductor layer.

Processes for forming the gate electrode GE, the first gate insulation layer 101, the second gate insulation layer 102 and the oxide semiconductor layer may be substantially the same as those illustrated with reference to FIGS. 3 and 4.

Figure 14:
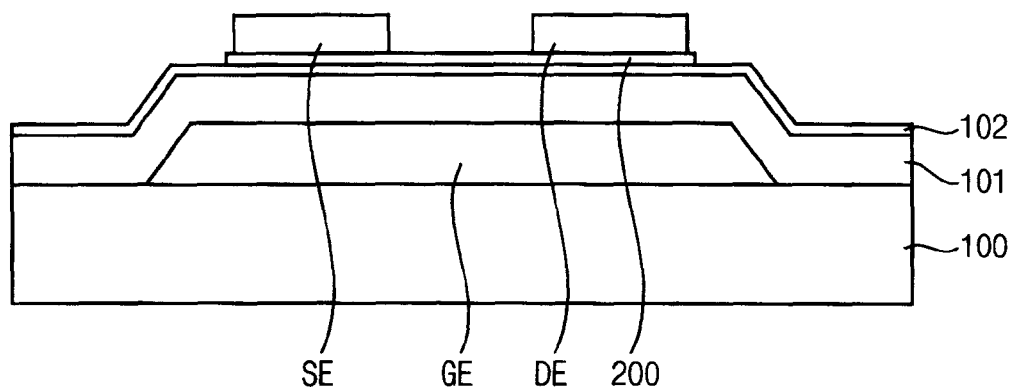

Referring to FIG. 14, a source electrode SE and a drain electrode DE are formed on the active pattern 200.

In one exemplary embodiment of forming the source and drain electrodes SE and DE, a data metal layer is formed on the second insulation layer 102, and then the data metal layer is patterned to form the source electrode SE and the drain electrode DE.

Referring to FIGS. 13 and 14, the active pattern 200 may be formed by a patterning process different from those of the source electrode SE and the drain electrode DE, so that the active pattern 200 may have a shape different from those of the source electrode SE and the drain electrode DE in a plan view. Therefore, the active pattern 200 may have an isolated island shape that may overlap with the source electrode SE and the drain electrode DE, and may not overlap with the data line DL and the gate line GL. Therefore, an inevitable photo current in the active pattern 200 may be reduced or prevented.

Figure 15:
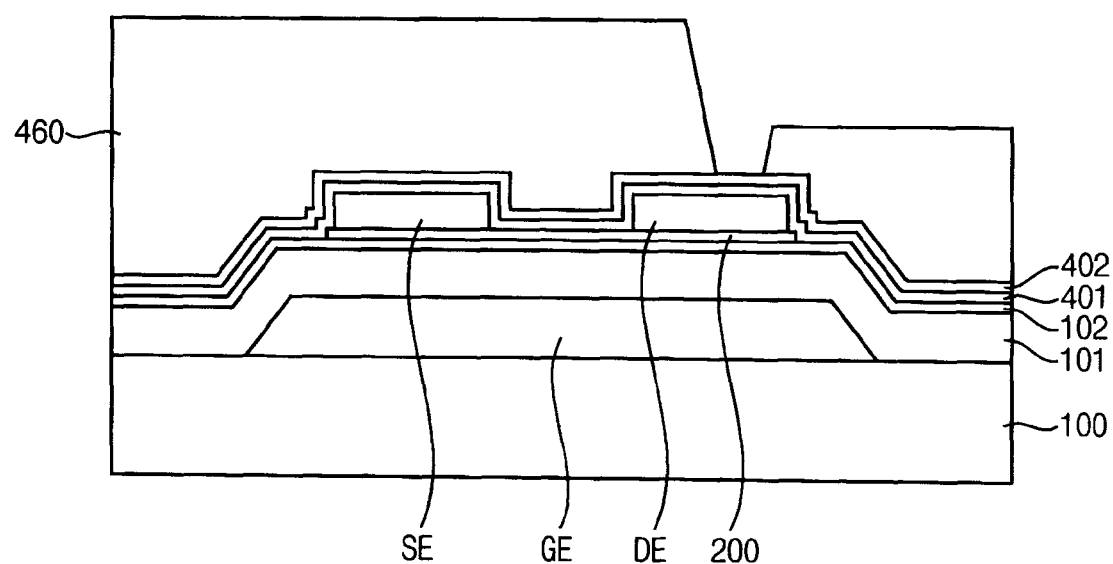

Referring to FIG. 15, a first passivation layer 401 and a second passivation layer 402 are formed to cover the source electrode SE, the drain electrode DE and the active pattern 220. Then, a second photoresist layer is formed on the second passivation layer 402, and the second photoresist layer is partially removed to form a second photoresist pattern 460. The second photoresist pattern 460 may be similar to that illustrated in FIG. 9, for example, the second photoresist pattern 460 may include a first thickness portion 461, and a second thickness portion 462 having a larger thickness than the first thickness portion 461.

Figure 16:
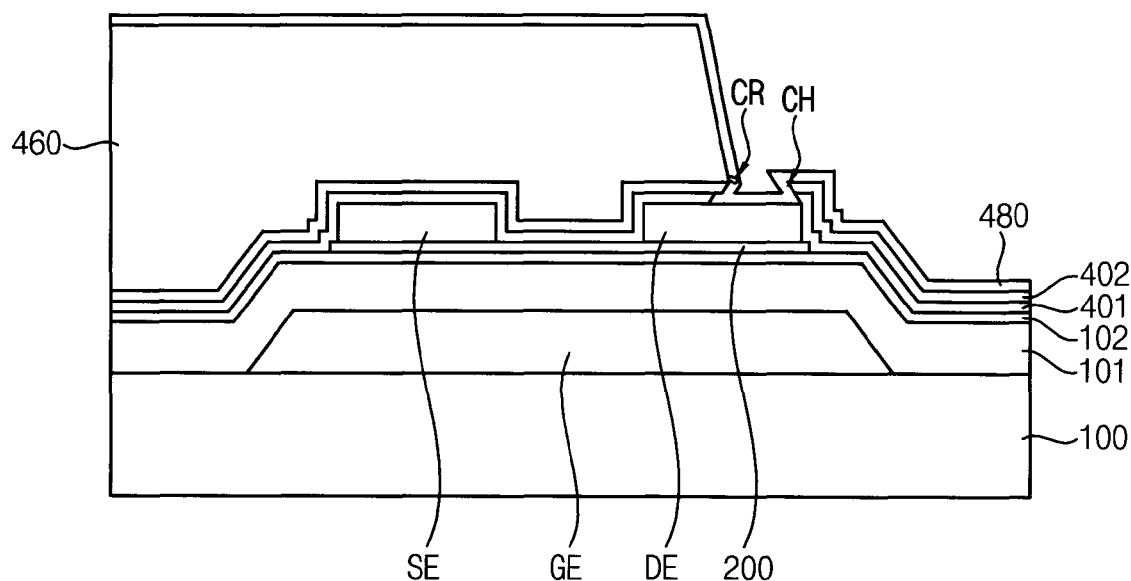

Referring to FIG. 16, the first passivation layer 401 and the second passivation layer 402 are partially removed to form a contact hole CH, and then a pixel electrode layer 480 is formed on the second photoresist pattern 460, the second passivation layer 402, an inner wall of the contact hole CH and the exposed surface of the drain electrode DE.

The first passivation layer 401 and the second passivation layer 402 are removed by a dry etching process using the second photoresist pattern 460 as an etching mask. In the dry etching process, an etch rate of the first passivation layer 401 may be substantially higher than that of the second passivation layer 402. Therefore, the second passivation layer 402 and a lower portion of the second photoresist pattern 460 protrude from the sidewall of the contact hole CH.

The pixel electrode layer 480 having a uniform thickness is formed on the second photoresist pattern 460, the second passivation layer 402 and an inner wall of the contact hole CH. Then, an annealing process is performed to heat the second photoresist pattern 460 and the pixel electrode layer 480, thereby forming a crack CR in the pixel electrode layer 480.

A strip process is performed to remove the remaining second photoresist pattern 460 and a portion of the pixel electrode layer 480, thereby forming a pixel electrode PE. Therefore, the pixel electrode PE is formed without performing an additional photolithography process.

In the exemplary embodiment illustrated with reference to FIGS. 13 to 16, the active pattern 200 is formed by a patterning process different from those of the source electrode SE and the drain electrode DE, and the display substrate excludes the etch stopper. In an alternative exemplary embodiment, the active pattern 200, the source electrode SE and the drain electrode DE are formed by the same patterning process, and the display substrate excludes the etch stopper. Hereinafter, a method of manufacturing a display substrate will be explained in which the active pattern 200, the source electrode SE and the drain electrode DE are formed simultaneously.

FIGS. 17 to 23 are cross-sectional views illustrating still another exemplary embodiment of a method of manufacturing a display substrate according to the invention.

Figure 17:
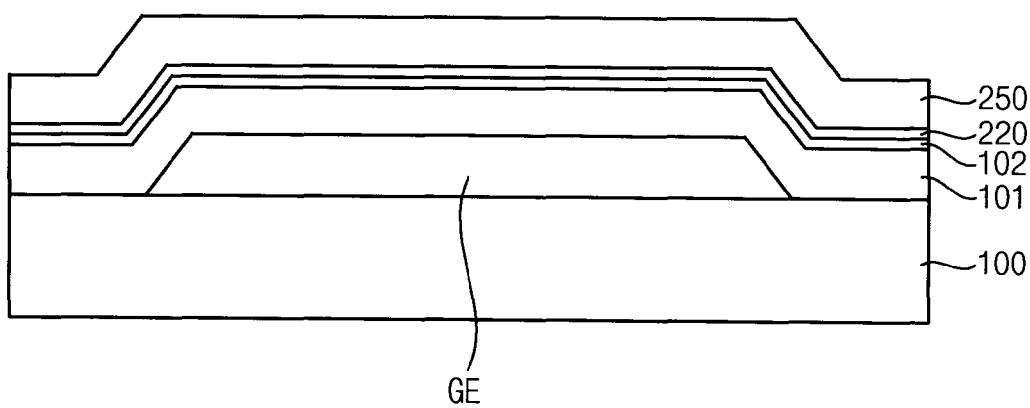
FIGS. 17 to 23 are cross-sectional views illustrating still another exemplary embodiment of a method of manufacturing a display substrate according to the invention.

Referring to FIG. 17, a gate line GL and a gate electrode GE are formed on a base substrate 100, and a first gate insulation layer 101, a second gate insulation layer 102, an oxide semiconductor layer 220 and a data metal layer 250 are sequentially formed to cover the gate line GL and the gate electrode GE.

Figure 18:
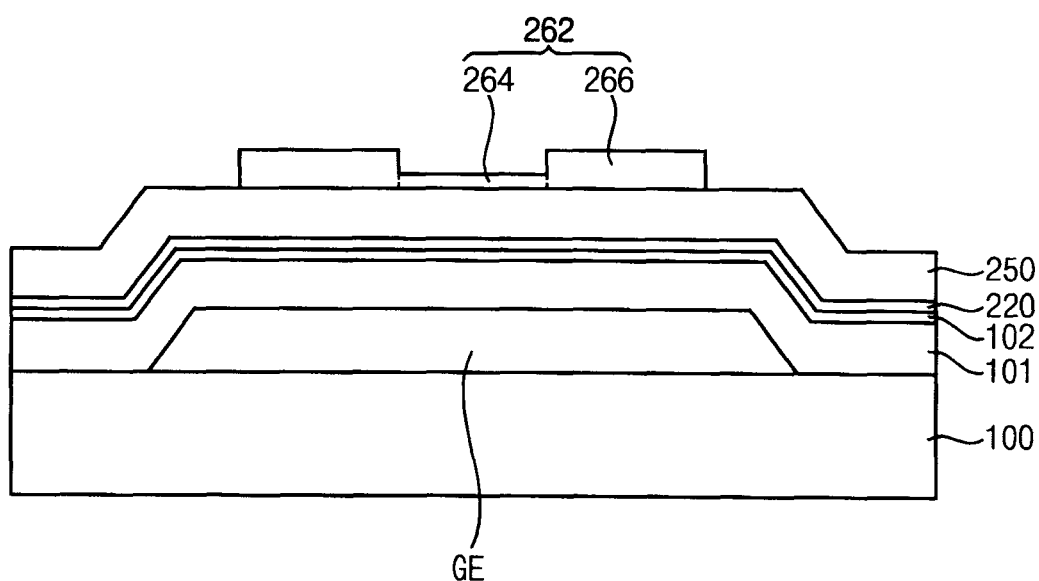

Referring to FIG. 18, a first photoresist pattern 262 is formed on the data metal layer 250.

In one exemplary embodiment of forming the first photoresist pattern 262, a first photoresist layer is formed on the date metal layer 250, and the first photoresist layer is patterned by using a half-tone mask or a slit mask.

The half-tone mask or the slit mask is divided into a transparent area, a semitransparent area and an opaque area according to a light transmittance. Depending on the light transmittance, the first photoresist layer is selectively exposed and developed. Therefore, the first photoresist pattern 262 may include a stepped portion. That is, the first photoresist pattern 262 may include a first thickness portion 264, and a second thickness portion 266 having a thickness larger than that of the first thickness portion 264. In one exemplary embodiment, the second thickness portion 266 may overlap with a region where a source electrode and a drain electrode will be disposed, and the first thickness portion 264 may overlap with a region between the source electrode and the drain electrode.

Figure 19:
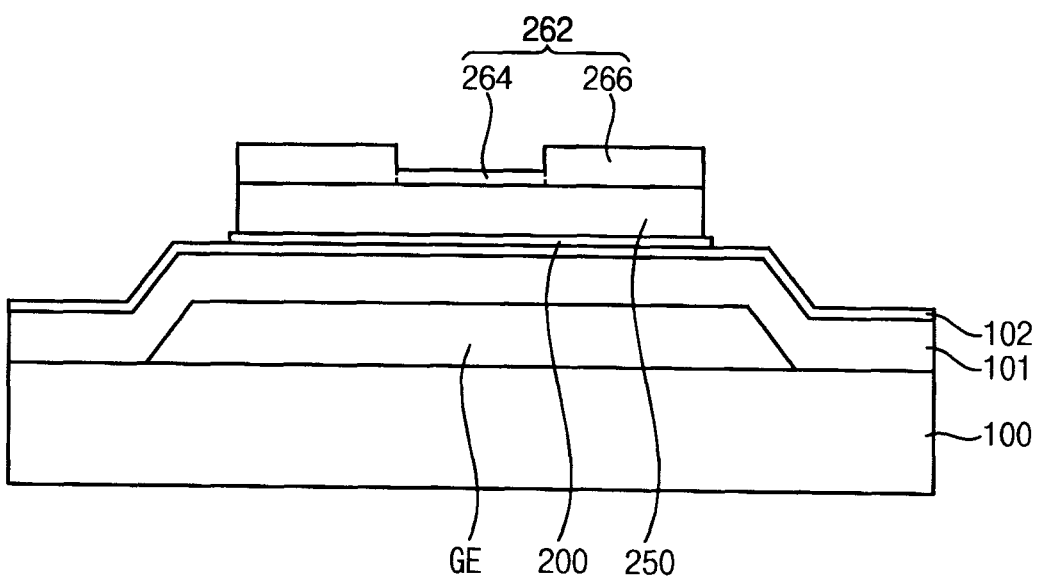

Referring to FIG. 19, the data metal layer 250 and the oxide semiconductor layer 220 are partially removed by using the first photoresist pattern 262 as an etch mask.

In the etching process, the oxide semiconductor layer 220 is partially removed to form an active pattern 200. However, portions of the data metal layer 250 covered by the first thickness portion 264 and the second thickness portion 266 of the first photoresist pattern 262 are not removed.

Figure 20:
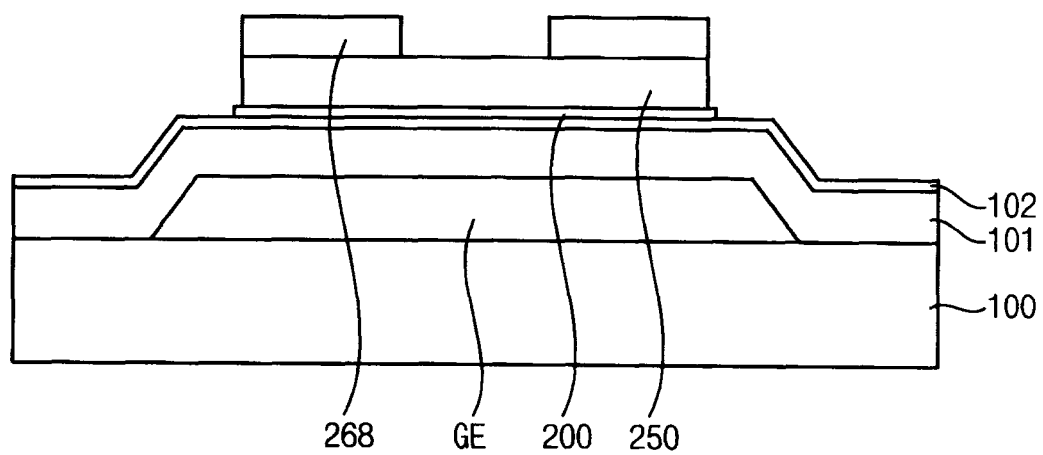

Referring to FIG. 20, the first photoresist pattern 262 is partially removed to form a residual photoresist pattern 268.

In one exemplary embodiment, the first photoresist pattern 262 may be partially removed by an etch back process. In the etch back process, the first thickness portion 264 is entirely removed, while the second thickness portion 266 is partially removed to form the residual photoresist pattern 268.

Figure 21:
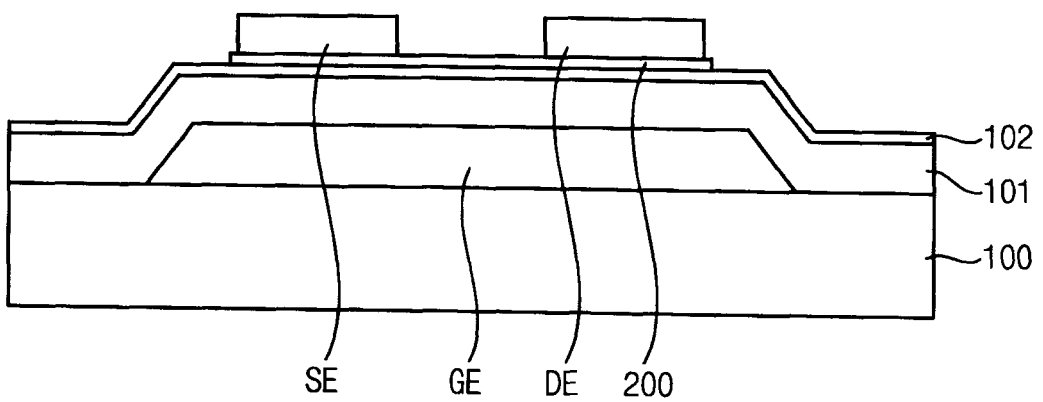

Referring to FIG. 21, the data metal layer 250 is partially removed by using the residual photoresist pattern 268 as a etch mask, thereby forming a source electrode SE and a drain electrode DE.

In one exemplary embodiment, the etching process is performed using an etching solution having a relatively low etch rate with respect to the active pattern 200. Therefore, the active pattern 200 is not removed or damaged during the etching process in forming the source and drain electrodes SE and DE. Accordingly, the source electrode SE, the drain electrode DE and the active pattern 200 having different shapes are patterned by using single mask, so that process time and cost may be reduced.

Then, a strip process or an ashing process is performed to remove the residual photoresist pattern 268.

Figure 22:
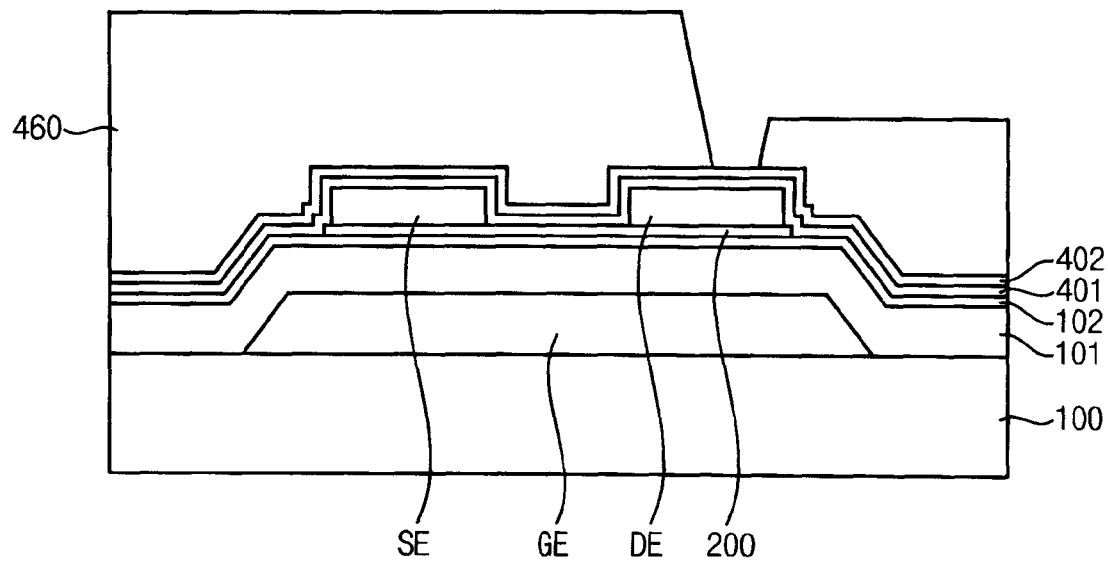

Referring to FIG. 22, a first passivation layer 401 and a second passivation layer 402 are formed to cover the source electrode SE, the drain electrode DE and the etch stopper 230. Then, a second photoresist layer is formed on the second passivation layer 402, and the second photoresist layer is partially removed to form a second photoresist pattern 460. The second photoresist pattern 460 may be similar to that illustrated in FIG. 9, for example, the second photoresist pattern 460 may include a first thickness portion 461, and a second thickness portion 462 having a larger thickness than the first thickness portion 461.

Figure 23:
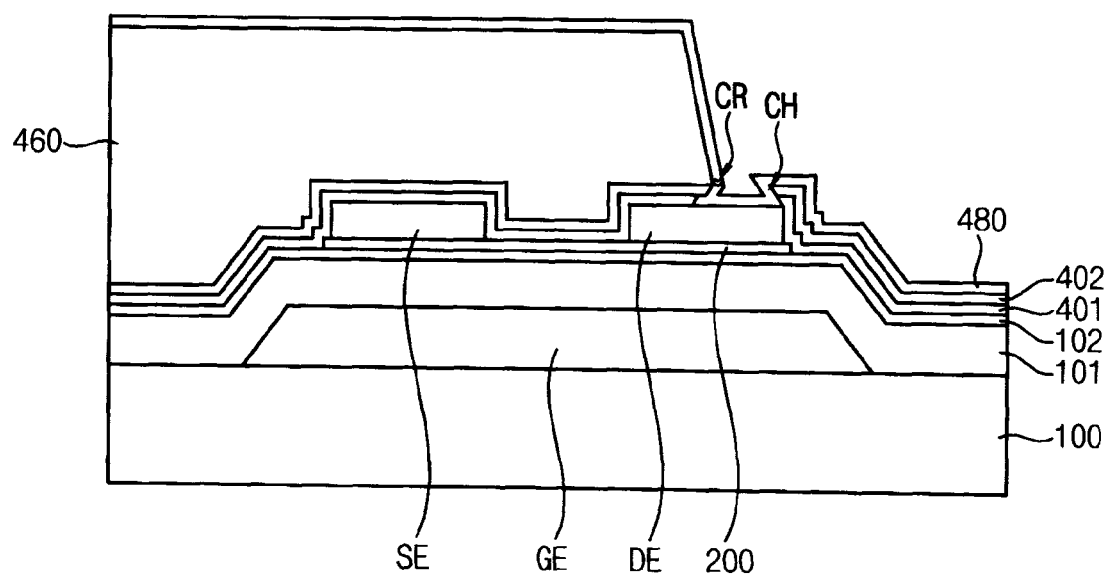

Referring to FIG. 23, the first passivation layer 401 and the second passivation layer 402 are partially removed to form a contact hole CH, and then a pixel electrode layer 480 is formed on the second photoresist pattern 460, the second passivation layer 402, an inner wall of the contact hole CH and an exposed surface of the drain electrode DE.

Then, a strip process is performed to remove the second photoresist pattern 460 and a portion of the pixel electrode layer 480, thereby forming a pixel electrode PE. Therefore, the pixel electrode PE is formed without performing an additional photolithography process.

FIGS. 24 to 28 are cross-sectional views illustrating yet another exemplary embodiment of a method of manufacturing a display substrate according to the invention.

Figure 24:
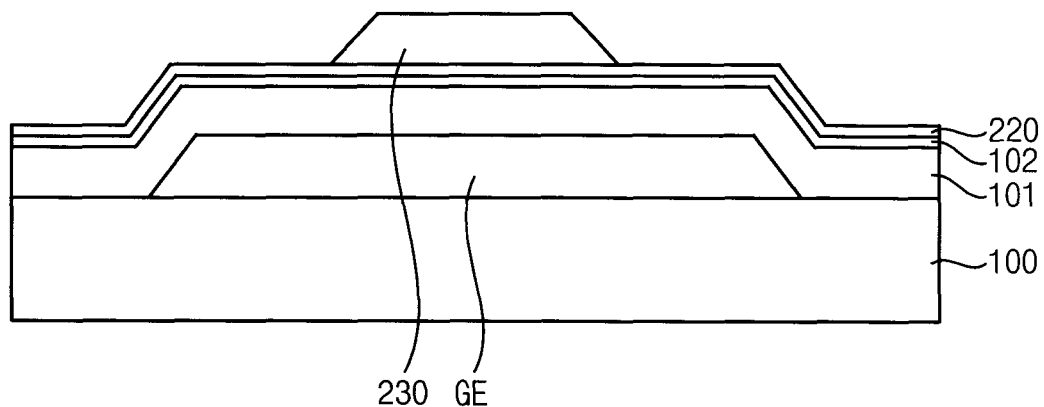
FIGS. 24 to 28 are cross-sectional views illustrating yet another exemplary embodiment of a method of manufacturing a display substrate according to the invention.

Referring to FIG. 24, a gate line GL and a gate electrode GE are formed on a base substrate 100, and a first gate insulation layer 101, a second gate insulation layer 102 and an oxide semiconductor layer 220 are sequentially formed to cover the gate line GL and the gate electrode GE. Then, an etch stopper 230 is formed on the oxide semiconductor layer 220.

Figure 25:
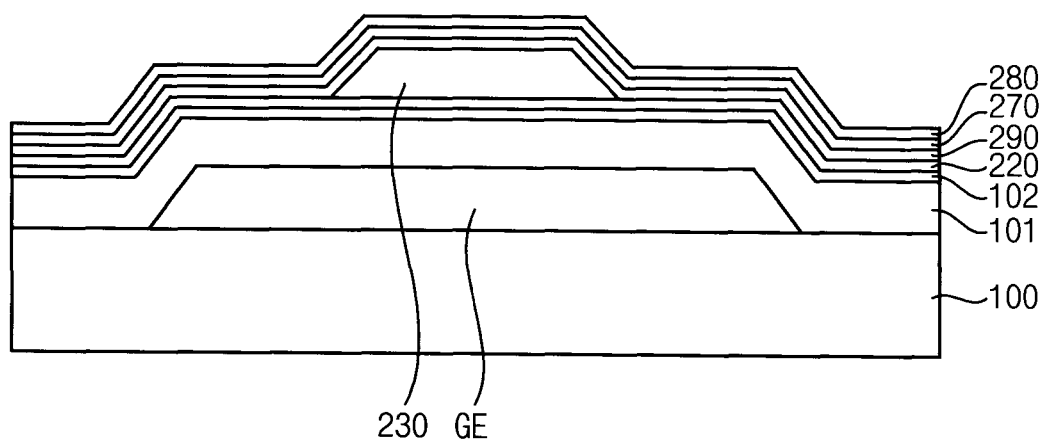

Referring to FIG. 25, an oxide layer 290, a first data metal layer 270 and a second data metal layer 280 are sequentially formed on the second gate insulation layer 102 and the etch stopper 230.

In one exemplary embodiment, the oxide layer 290 includes a conductive oxide material. For example, the oxide layer 290 may include IZO, ITO, GZO or ZAO.

The first data metal layer 270 and the second data metal layer 280 may include aluminum, copper, molybdenum, tantalum, tungsten, neodymium, chromium, silver, manganese, alloy thereof and the like. In one exemplary embodiment, for example, the first data metal layer 270 may include copper, and the second data metal layer 280 may include an alloy of copper and manganese.

Figure 26:
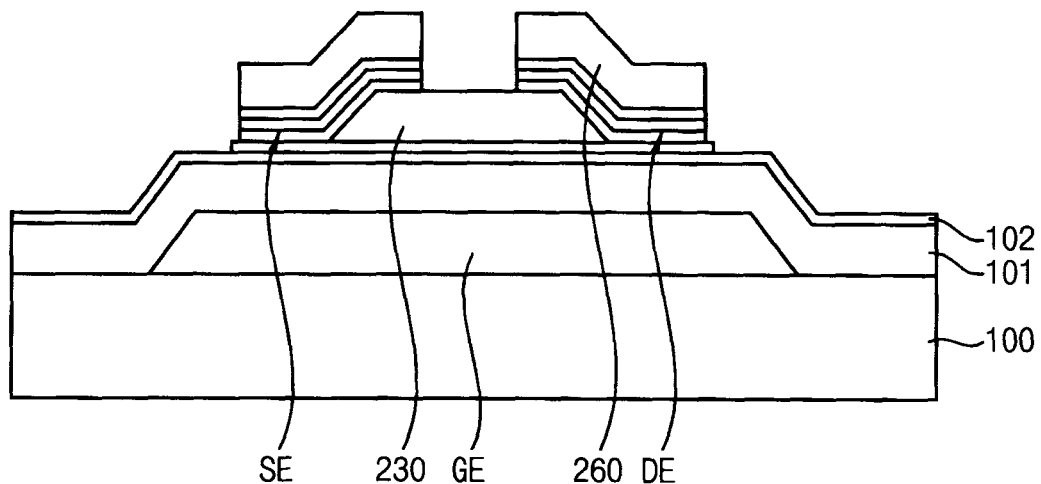

Referring to FIG. 26, a first photoresist pattern 260 is formed on the second data metal layer 280, and then the oxide layer 290, the first data metal layer 270 and the second data metal layer 280 are partially removed using the first photoresist pattern 260, thereby forming an active pattern 200, a source electrode SE, a drain electrode DE and an oxide pattern under the source and drain electrodes SE and DE, simultaneously.

The active pattern 200, the source electrode SE and the drain electrode DE, and the oxide pattern under the source and drain electrodes SE and DE are formed by a single patterning process using a single mask. Further, the etch stopper 230 may serve as an etching end point, so that the active pattern 200 may have a shape different from those of the source electrode SE and the drain electrode DE. Therefore, the patterning process may be simplified.

Then, the first photoresist pattern 260 may be removed by a strip process or an ashing process.

Figure 27:
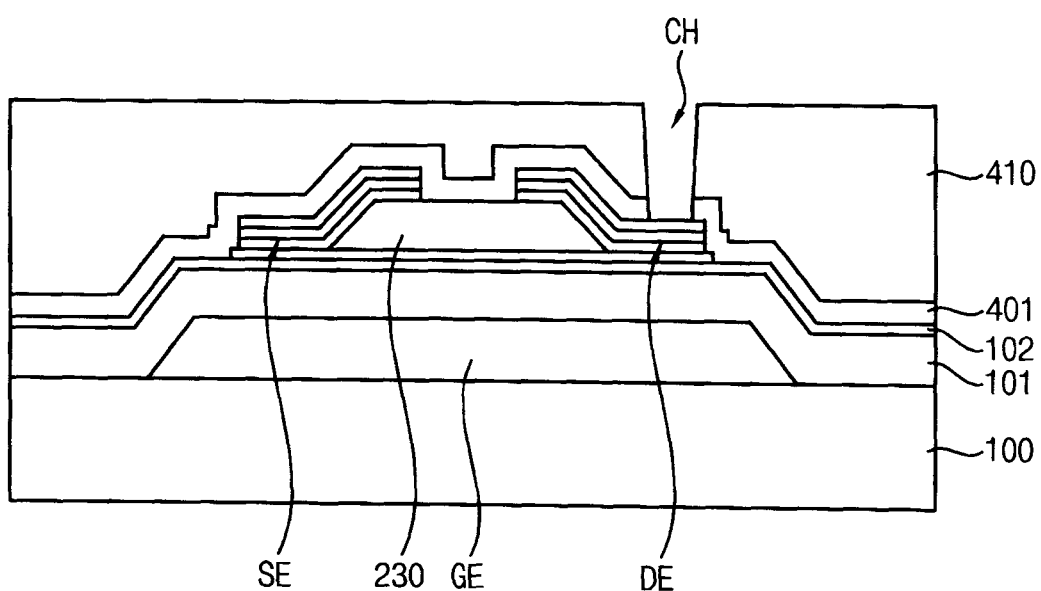

Referring to FIG. 27, a first passivation layer 401 and an organic insulation layer 410 are formed to cover the source electrode SE, the drain electrode DE and the etch stopper 230, and then the first passivation layer 401 and the organic insulation layer 410 are partially removed to form a contact hole CH.

In one exemplary embodiment, the first passivation layer 401 may include an inorganic insulation material such as silicon nitride. A second passivation layer (not shown) may further disposed on the first passivation layer 401.

The organic insulation layer 401 having a flat top surface is formed by a coating process such as a spin coating process.

Figure 28:
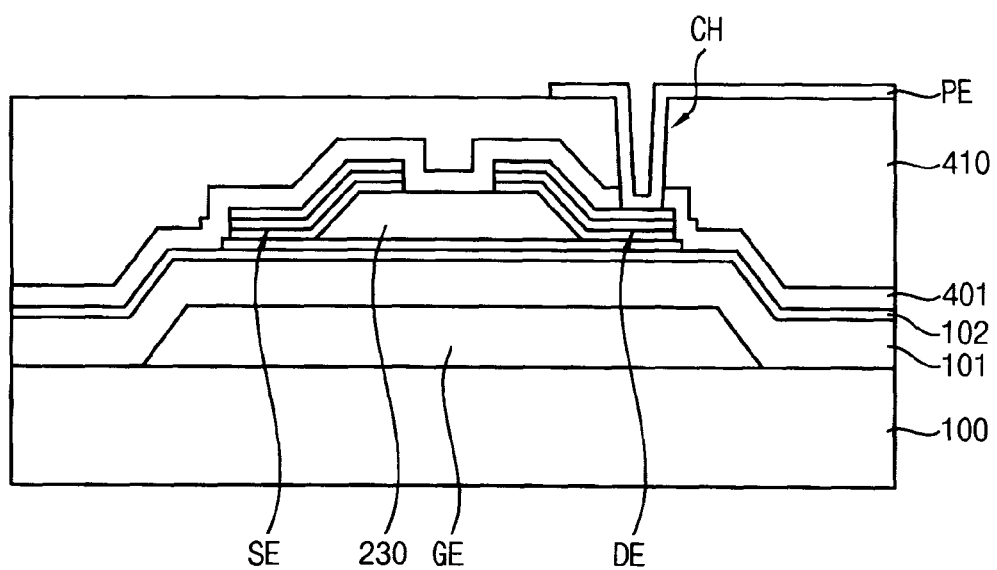

Referring to FIG. 28, a pixel electrode layer is formed on the organic insulation layer 410 and an inner wall of the contact hole CH, and the pixel electrode layer is patterned to form a pixel electrode PE.

Thus, it can be noted that a thin film transistor manufactured according to one or more exemplary embodiment of the invention may have high electron mobility and reliability.

One or more exemplary embodiment of a display substrate in accordance with the invention may be used for a display device such as a liquid crystal display device or an OLED display device.

The foregoing is illustrative of the invention and is not to be construed as limiting thereof. Although a few exemplary embodiments have been described, those skilled in the art will readily appreciate from the foregoing that many modifications are possible in the exemplary embodiments without materially departing from the novel teachings and advantages of the invention. Accordingly, all such modifications are intended to be included within the scope of the invention. In the claims, means-plus-function clauses are intended to cover the structures described herein as performing the recited function and not only structural equivalents but also functionally equivalent structures.

What is claimed is:

1. A method of manufacturing a display substrate, the method comprising:
    forming a thin film transistor on a base substrate, the thin film transistor comprising a gate electrode, an active pattern, a source electrode and a drain electrode;
    forming a first passivation layer covering the thin film transistor;
    forming a second passivation layer on the first passivation layer;
    forming a first photoresist pattern partially exposing the second passivation layer;
    partially removing the first passivation layer and the second passivation layer via dry etching process to form a contact hole exposing the drain electrode, the dry etching process using an etching solution having a higher etch rate with respect to the first passivation layer compared to an etch rate with respect to the second passivation layer;
    forming a pixel electrode layer on the second passivation layer, the drain electrode and the first photoresist pattern; and
    removing a portion of the pixel electrode layer and the first photoresist pattern to form a pixel electrode, wherein the portion of the pixel electrode layer is on a top surface and a sidewall of the first photoresist pattern.

2. The method of claim 1, wherein a first distance between sidewalls of the first passivation layer exposed by the contact hole is larger than a second distance between sidewalls of the second passivation layer exposed by the contact hole.

3. The method of claim 1, further comprising performing an annealing process on the first photoresist pattern and the pixel electrode layer, to form a crack in the pixel electrode layer, before the removing the portion of the pixel electrode layer to form the pixel electrode.

4. The method of claim 1, wherein
the first passivation layer comprises a first insulation material, and
the second passivation layer comprises a second insulation material different from the first insulation material.

5. The method of claim 4, wherein
the first passivation layer comprises silicon nitride, and
the second passivation layer comprises silicon oxide.

6. The method of claim 1, wherein the active pattern comprises a metal oxide semiconductor.

7. The method of claim 1, wherein the forming the thin film transistor comprises:
forming the gate electrode on the base substrate;
forming a gate insulation layer covering the gate electrode;
forming a metal oxide semiconductor layer on the gate insulation layer, and overlapping the gate electrode;
forming a data metal layer on the metal oxide semiconductor layer; and
partially removing the metal oxide semiconductor layer and the data metal layer to form the source electrode, the drain electrode and the active pattern, simultaneously.

8. The method of claim 7, further comprising forming an etch stopper on the metal oxide semiconductor layer, before the forming the data metal layer.

9. The method of claim 8, wherein the partially removing the metal oxide semiconductor layer and the data metal layer comprises:
forming a second photoresist pattern on the data metal layer; and
etching the data metal layer using the second photoresist pattern as an etching mask,
wherein the etching is performed until a top surface of the etch stopper is exposed.

10. The method of claim 8, wherein the partially removing the metal oxide semiconductor layer and the data metal layer comprises:
forming a photoresist layer on the data metal layer;
forming a second photoresist pattern having a stepped portion by using a half-tone mask or a slit mask; and
etching the data metal layer using the second photoresist pattern as an etching mask,
wherein the etching is performed until a top surface of the etch stopper is exposed.

11. The method of claim 7, further comprising annealing the metal oxide semiconductor layer at a temperature of about 100° C. to about 700° C.

12. The method of claim 7, further comprising forming an oxide layer on the metal semiconductor oxide layer, before the forming the data metal layer,
wherein
the oxide layer comprises indium-zinc oxide, indium-tin oxide, gallium-zinc oxide or zinc-aluminum oxide, and
the partially removing the metal oxide semiconductor layer and the data metal layer further comprises partially removing the oxide layer.

13. A method for manufacturing a display substrate, the method comprising:
forming a gate electrode on a base substrate;
forming a gate insulation layer covering the gate electrode;
forming a metal oxide semiconductor layer on the gate insulation layer, and overlapping the gate electrode;
forming an oxide layer on the metal oxide semiconductor layer;
forming a data metal layer on the oxide layer; and
partially removing the metal oxide semiconductor layer, the oxide layer and data metal layer to form the source electrode, the drain electrode and the active pattern, simultaneously.

14. The method of claim 13, further comprising forming an etch stopper on the metal oxide semiconductor layer, before the forming the oxide layer.

15. The method of claim 13, wherein
the oxide layer comprises indium-zinc oxide, indium-tin oxide, gallium-zinc oxide or zinc-aluminum oxide, and
the data metal layer comprises a plurality of metal layers, comprising:
a first metal layer comprising copper, and
a second metal layer comprising an alloy of copper and manganese.

* * * * *